(12) United States Patent
Basol

(10) Patent No.: US 8,017,861 B2
(45) Date of Patent: Sep. 13, 2011

(54) SUBSTRATE PREPARATION FOR THIN FILM SOLAR CELL MANUFACTURING

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 283 days.

(21) Appl. No.: 12/233,566

(22) Filed: Sep. 18, 2008

(65) Prior Publication Data

US 2009/0078313 A1 Mar. 26, 2009

Related U.S. Application Data

(60) Provisional application No. 60/973,443, filed on Sep. 18, 2007.

(51) Int. Cl.
*H01L 31/0224* (2006.01)
(52) U.S. Cl. ........... 136/256; 438/98; 136/252; 136/262
(58) Field of Classification Search .......... 136/252–265; 438/57
See application file for complete search history.

(56) References Cited

U.S. PATENT DOCUMENTS

| | | | | |
|---|---|---|---|---|
| 6,379,476 B1* | 4/2002 | Tarutani et al. | ............... | 148/325 |
| 7,238,618 B2* | 7/2007 | Mueller et al. | ............... | 438/689 |
| 7,241,717 B2* | 7/2007 | Ito et al. | ............... | 502/326 |
| 7,824,947 B2* | 11/2010 | Pinarbasi et al. | ............... | 438/57 |
| 2005/0072461 A1* | 4/2005 | Kuchinski et al. | ............ | 136/256 |
| 2005/0205128 A1* | 9/2005 | Deng et al. | ................... | 136/256 |
| 2010/0252110 A1* | 10/2010 | Yago et al. | .................... | 136/261 |

OTHER PUBLICATIONS

Basol, "Modules and Flexible Cells of CuInSe2", *Proc. of the 23rd Photovoltaic Specialists Conf.*, 1994, p. 426.
Kessler, F., et al., "Approaches to Flexible CIGS Thin-Film Solar Cells", *Thin Solid Films*, vol. 480-481, 2005, pp. 491-498.

* cited by examiner

*Primary Examiner* — Jennifer K. Michener
*Assistant Examiner* — Jayne Mershon
(74) *Attorney, Agent, or Firm* — Pillsbury Winthrop Shaw Pittman LLP

(57) ABSTRACT

A thin film solar cell including a Group IBIIIAVIA absorber layer on a defect free base including a stainless steel substrate is provided. The stainless steel substrate of the base is surface treated to reduce the surface roughness such as protrusions that cause shunts. In one embodiment, the surface roughness is reduced by coating surface with a thin silicon dioxide which fills the cavities and recesses around the protrusions and thereby reducing the surface roughness. After the silicon dioxide film is formed, a contact layer is formed over the ruthenium layer and the exposed portions of the substrate to complete the base.

15 Claims, 2 Drawing Sheets

SUBSTRATE PREPARATION FOR THIN FILM SOLAR CELL MANUFACTURING

This application relates to and claims priority from U.S. Provisional Application No. 60/973,443, entitled "Substrate Planarization for Thin Film Solar Cell Manufacturing," filed Sep. 18, 2007, which application is expressly incorporated by reference herein.

BACKGROUND

1. Field of the Invention

The present inventions relate to preparation of conductive foil substrates for thin film solar cell fabrication, especially solar cells employing Group IBIIIAVIA absorbers.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(SySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional foil-substrate based Group IBIIIAVIA compound photovoltaic cell such as a $Cu(In,Ga,Al)(S,Se,Te)_2$ thin film solar cell is shown in FIG. 1. The device 10 is fabricated on a base 10A which includes a substrate 11 coated with a conductive layer 13. The substrate 11 is a conductive foil or web, such as such as stainless steel. Various metallic foil substrates, such as Cu, Ti, Mo, Ni, Al, stainless steel have previously been identified for CIGS(S) solar cell applications (see for example, B. M. Basol et al., "Status of flexible CIS research at ISET", NASA Document ID:19950014096, accession No: 95N-20512, available from NASA Center for AeroSpace Information, and B. M. Basol et al., "Modules and flexible cells of CuInSe2", Proceedings of the 23rd Photovoltaic Specialists Conference, 1993, page 426). The absorber film 12, which comprises a material in the family of $Cu(In,Ga,Al)(S,Se,Te)_2$, is grown over the conductive layer 13, which is previously deposited on the substrate 11 and which acts as the electrical contact to the device. Various conductive layers 13 or contact layers comprising contact materials such as Mo, Ta, W, Ti, TiN etc. have been used in the solar cell structure of FIG. 1. The conductive layer 13 may be a single layer or a stacked layer. For example, Cr/Mo stacked conductive layer is commonly used in the CIGS(S) solar cell structure because Cr improves adhesion of Mo to the substrate. After the absorber film 12 is grown, a transparent layer 14 such as a CdS, ZnO, CdS/ZnO stack or CdS/ZnO/ITO stack is formed on the absorber film. Radiation 15 enters the device through the transparent layer 14. Metallic grids (not shown) may also be deposited over the transparent layer 14 to reduce the effective series resistance of the device.

One problem associated with the device structure of FIG. 1 is the surface roughness of the foil substrate 11. As depicted in FIG. 1, the surface of metallic foils such as stainless steel foils often have protrusions 15 and pits 16, which may have heights or depths in the range of 500-2000 nm, or even larger. The contact layers or conductive layer 13 is typically a 200-1000 nm thick film of a refractory metal such as Mo, typically deposited by a physical vapor deposition technique such as sputtering. Therefore, when deposited over the rough surface of the substrate 11, the conductive layer 13 may have discontinuities, especially over the locations of the protrusions 15 and pits 16. When the absorber film 12 is formed over the contact layer 13, the substrate 11 would be exposed to the absorber film 12 at the locations of the discontinuities. As a result, chemical interaction may take place between the substrate 11 and the absorber film 12 at these locations. For example, for stainless steel substrates, Fe diffusing from the substrate 11 into the absorber 12 through the discontinuities in the contact layer 13 may poison the regions of the absorber 12 directly above the discontinuities. When the solar cells are completed by deposition of the transparent layer 14, these poisoned regions cause excessive current leakage reducing the efficiency of the devices. Alternately, the regions where the contact layer 13 is discontinuous, don't get coated effectively by the absorber film 12, giving rise to pinholes, which are very undesirable defects for solar cells as they render the cells inoperable.

In the past researchers have deposited thick insulating layers on foil substrates to planarize and at the same time insulate the surface of such metallic foils. FIG. 2 shows such a structure where the rough surface 20 of a metallic foil substrate 21 is coated with a planarizing insulator 22. The thickness of the planarizing insulator 22 is larger than the roughness of the rough surface 20, therefore, it provides a smooth surface 22A on which a solar cell may be fabricated. Fabrication of the solar cell includes the steps of; i) depositing a conductive contact 23 on the smooth surface 22A, ii) depositing an absorber layer 24 on the conductive contact 23, and iii) forming a transparent conductive top contact 25 on the absorber layer 24. It should be noted that, in the structure of FIG. 2, the metallic foil substrate 21 is electrically isolated from the conductive contact 23 by the planarizing insulator 22. Therefore, the two terminals of the device are connected to the conductive contact 23 and the transparent conductive top contact 23.

Since the current passes through the relatively thin conductive contact, which may be a 100-1000 nm thick metal such as Mo, the device structure of FIG. 2 cannot be used to fabricate large cells. If large devices with at least one dimension larger than 5-20 cm are fabricated using this approach, the excessive voltage drop within the thin conductive contact would deteriorate the fill factor values and reduce conversion efficiency.

This is the reason structures such as the one shown in FIG. 2 may be used for making thin film cell modules employing well known monolithic integration techniques where narrow but long solar cells are interconnected in series on top of the thick insulating layer. Such solar cells may have a width of 0.5-5 cm and a length of 30-60 cm or even longer. As described before, once the width of the cells become much larger than about 5 cm, voltage drop causes deterioration of the solar cell parameters, especially fill factor.

SUMMARY

Present inventions provide a multilayer structure for manufacturing solar cells. In this structure, a substrate of the solar cell is in electrical communication with a contact layer through a high resistivity or insulating buffer layer which is interposed between them.

The multilayer structure of the preferred embodiments of the present inventions include a stainless steel substrate having raised and recessed surface features and the buffer layer is formed on the conductive substrate. The buffer layer is a high resistivity layer with resistivity of at least 1000 ohm-com, which substantially fills the recessed surface features while leaving partially exposed the raised surface features. The contact layer of the multilayer structure is formed on the buffer layer and on the exposed portions of the raised surface features.

These and other aspects and advantages are discussed herein.

DETAILED DESCRIPTION

Embodiments of present inventions provide a flexible foil base that enhances the efficiency and manufacturing yield of flexible II-VI compound semiconductor solar cells, i.e. Group IIBVIA thin film solar cells such as CdTe solar cells and Group IBIIIAVIA thin film solar cells such as CIGS(S) type solar cells. The preferred solar cell structure is a Group IBIIIAVIA thin film solar cell which will be described below.

The base of the thin film solar cell includes a highly conductive metallic substrate that is surface treated using a process that employs an insulating or high resistivity and permanent buffer film to cover the surface of the metallic substrate while the protrusions such as peaks or spikes on the surface are exposed to provide conductivity. Although the embodiments will be described using a CIGS solar cell as an example, it will be appreciated that any flexible thin film solar cell employing a Group IBIIIAVIA compound semiconductor absorber film can be used. In a particular embodiment of the present invention, a flexible foil base may comprise a stainless steel substrate, an insulating or high resistivity buffer film (with resistivity value of at least 1000 ohm-cm) formed on the stainless steel substrate, and a defect free continuous back contact layer formed over the protective film. The buffer layer is a discontinuous layer which partially exposes surface of the underlying metallic substrate so that when the contact layer (ohmic contact layer) is formed on the buffer layer, the contact layer becomes electrically and physically connected to the underlying substrate. This way, efficient solar cells with large dimensions such as 10 cm by 10 cm, 20 cm by 20 cm or larger dimensions may be fabricated.

The back contact layer is deposited on the buffer film and the exposed substrate portions. As opposed to the above described prior art back contact films, the back contact film herein is preferably a continuous film having no discontinuities or defects and strongly adheres to the high resistivity or insulating buffer film as well as the exposed substrate portions. In the following steps, an absorber layer and a transparent layer is formed on the base.

Figure 3:
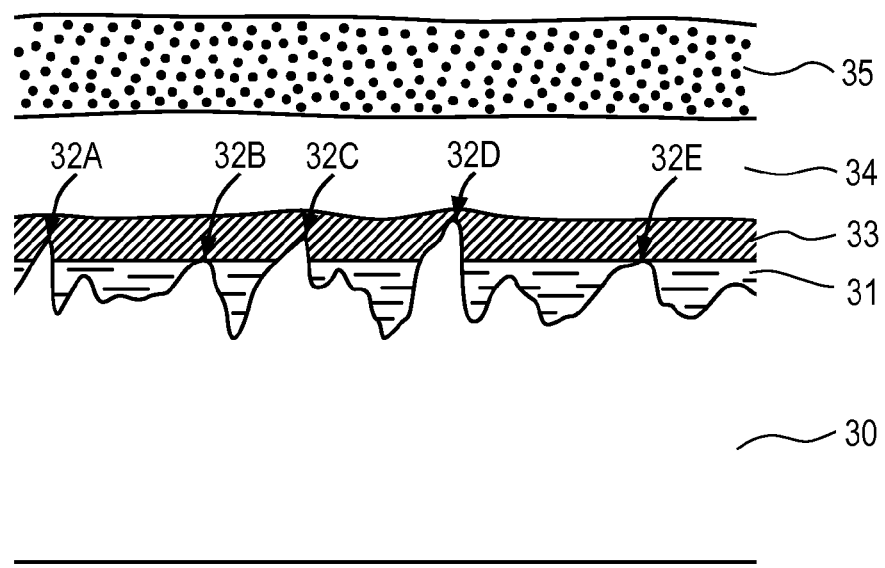
FIG. 3 illustrates a thin highly resistive film between a substrate and a contact layer according to one embodiment of the present invention.

Reference will now be made to the drawings wherein like numerals refer to like parts throughout. FIG. 3 shows an exemplary solar cell structure constructed in accordance with embodiments of the present invention. The substrate 30 is a metallic foil with a surface roughness. The metallic foil may be a stainless steel or aluminum based foil that is 25-150 micrometers thick. The surface roughness is defined as a value "R" which may be the distance between the highest point of a protrusion (an elevated or raised portion of the surface) and the lowest point of the substantially flat surface, which resembles a dimple or a recessed portion of the surface) on the top surface of the foil. The protrusions may be defective surface regions having mostly peaks or spikes of steel extending outwardly from the surface of the foil. An exemplary value for "R" may be in the range of 0.1-4 micrometers. An insulating material layer 31 or a buffer layer is deposited on the rough surface of the substrate 30 in a way that leaves the tips 32A-32E of the protrusions substantially uncovered. Once the insulating material layer 31 coats the cavities and dimples of the substrate surface, the protrusions of the surface may be seen as extending through the discontinuous regions or openings in the insulating material layer 31. Consequently, when a conductive contact layer 33 is deposited over the insulating layer 31, electrical shorts are formed between the substrate 30 and the conductive contact layer 33. The average thickness of the insulating material layer 31 may be in the range of 10-80% of the "R" value, preferably in the range of 20-60% of the "R" value to offer adequate planarization and at the same time assure electrical connection between the substrate and the conductive contact layer 33. In general the insulating buffer layer may have thickness in the range of 10-200 nm.

Figure 1:
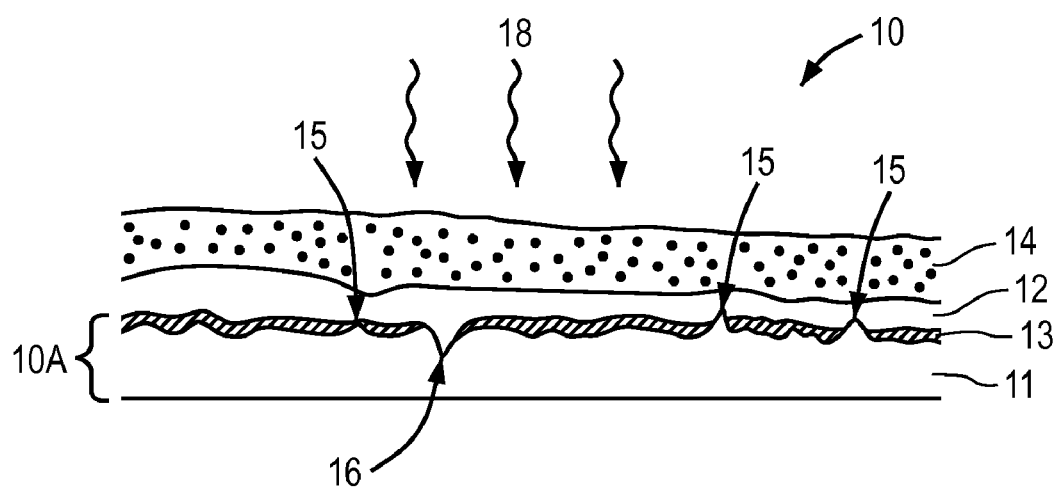
FIG. 1 is a cross-sectional view of a solar cell employing a Group IBIIIAVIA absorber layer.
Figure 2:
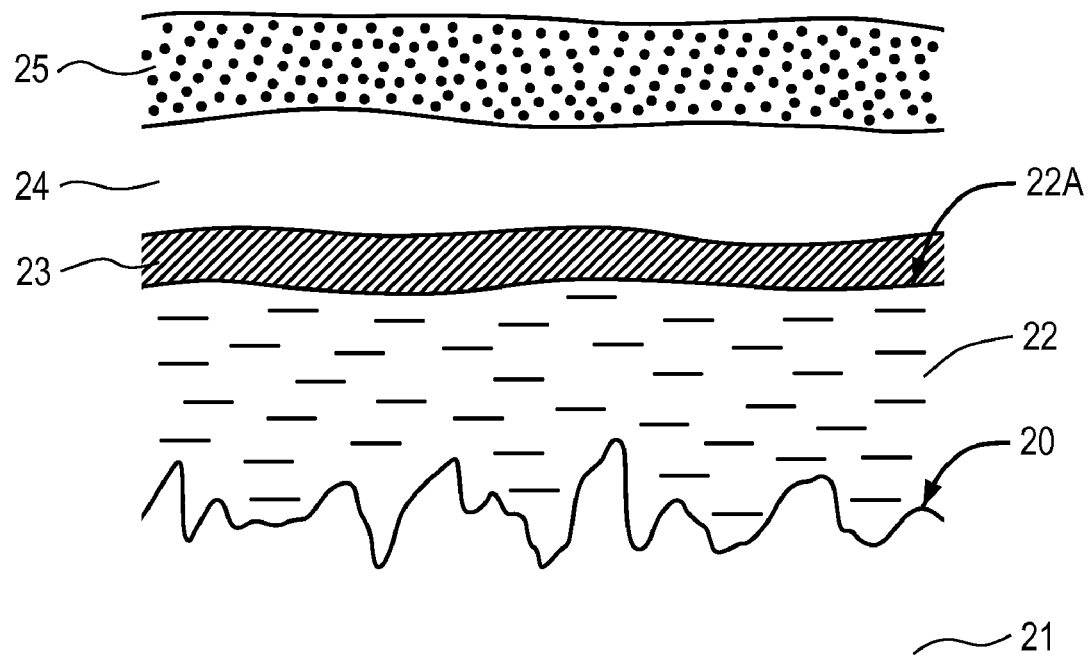
FIG. 2 shows a conventional thick planarization under a contact layer.

It should be noted that, since all the cavities or dimples on the substrate surface are filled with the insulating material layer 31 and since the effective height of the protrusions are reduced by the insulating layer 31, when the conductive contact layer 33 is formed, this contact layer 33 does not suffer from discontinuities seen in the prior art contact layers described with respect to FIG. 1. Good quality solar cells may, therefore be formed on the conductive contact layer 33 by depositing an absorber layer 34 over the contact layer 33, a transparent layer 35 on the absorber layer 34 and conductive fingers and busbars (not shown) on the transparent layer. The absorber layer 34 may be a Group IBIIIAVIA semiconductor absorber layer such as a CIGS layer is formed on the contact layer 33. The transparent layer 35 includes a buffer layer (not shown) and a transparent conductive layer (not shown). The contact layer 33 may be a multi-layer structure itself comprising materials that provide; i) good diffusion barrier action against iron (Fe) diffusion into the CIGS absorber layer, ii) good ohmic contact to the CIGS absorber layer, and, iii) good adhesion to the flexible substrate. Such materials include, but are not limited to tungsten (W), tantalum (Ta), molybdenum (Mo), titanium (Ti), chromium (Cr), ruthenium (Ru) and iridium (Ir), osmium (Os) their alloys and/or nitrides.

It should be noted that the structure of FIG. 3 allows current flow between the conductive contact layer 33 and the metallic foil substrate 30. Therefore, during the operation of the device current can pass through the relatively thick substrate 30. This allows fabrication of large area cells with both widths and lengths exceeding 10 cm or more. Partial planarization by the insulating material layer 31 avoids discontinuities therefore pinholes and other defects in the conductive contact layer. This improves device conversion efficiency and yields.

The insulating material layer may have a resistivity value that is equal to or larger than the resistivity of the absorber layer. For example the bulk resistivity of the insulating material layer may be larger than or equal to about 1000 ohm-cm, preferably larger than or equal to 10,000 ohm-cm. The insulating material layer may comprise silicon oxide or other oxides in liquid form. For example, spin-on-glass may be used as the insulating material layer which may be deposited by techniques such as spinning, rolling, dipping, doctor blading, spraying, roll coating or the like.

In another embodiment, the insulating material layer may be deposited thick enough to cover the entire surface of the metallic substrate 30 including the tips 32A-32E of the protrusions. Once thick high resistivity material layer is formed, it is planarized or polished using a material removal technique to expose the tips of the protrusions so that the protrusions have a flat top surface. Alternatively, using suitable material removal techniques, the height of the metallic protrusions may also be reduced, along with the thickness of the insulating material layer, and may consequently be made co-planar with the planarized surface of the insulating material, in which case the protrusions will also have a flat top surface. In either alternative, once the material removal step is complete, a contact layer is deposited on the insulating layer and the exposed portions of the metallic substrate, thereby providing for dependable electrical connection between the contact layer and the metallic substrate. Exemplary material removal techniques include but are not limited to chemical mechanical polishing, mechanical polishing and buffing techniques, and wet or dry material removal techniques and the like.

The absorber layer 34 may be deposited on the contact layer 33 using various techniques well known in the field. These techniques include evaporation, sputtering, ink deposition, electroplating, two-stage techniques, etc. In electroplating method, first a precursor film including at least copper, indium and gallium may be electroplated. The precursor film may then be reacted at about 400-600° C. in presence of selenium and/or sulfur (which may be included in the precursor film or may be provided from the reaction environment) to form the CIGS absorber layer. The buffer layer is often a sulfide compound such as cadmium sulfide and indium sulfide. The transparent conductive layer may be a transparent conductive oxide (TCO) such as zinc oxide (ZnO), indium tin oxide (ITO), and indium zinc oxide (IZO). The transparent conductive layer may also be a stacked layer of the TCOs listed above.

In roll-to-roll manufacturing of CIGS solar cells, all of the above described process steps may be performed in a roll-to-roll process tool. In a roll to roll process, the substrate may be a continuous workpiece that may be supplied from a supply roll. After some of or all of the above described process steps, e.g., forming of the insulating material layer, forming of the contact layer and the following steps, the processed workpiece is taken up and wrapped around a receiving roll. The absorber layer 34, the transparent layer 35, and the finger patterns may also be deposited in a roll-to-roll tool fashion.

Although the present inventions are described with respect to certain preferred embodiments, modifications thereto will be apparent to those skilled in the art.

I claim:

1. A process of manufacturing a thin film solar cell base structure, comprising:
   providing a conductive substrate having a top surface including protruded surface portions and substantially flat surface portions;
   depositing a high resistivity material to form a buffer layer on the top surface of the conductive substrate, wherein the high resistivity material substantially covers the substantially flat surface portions while leaving partially exposed some of the protruded surface portions;
   depositing a conductive material on the buffer layer and on the some of the protruded surface portions to form a contact layer that is electrically connected to the conductive substrate through the some of the protruded surface portions; and
   forming an absorber on the contact layer, wherein the contact layer is configured to act as an electrode for the absorber layer.

2. The method of claim 1, wherein the conductive material comprises one of tungsten, tantalum, molybdenum, titanium, chromium, ruthenium, iridium and osmium.

3. The method of claim 2 wherein the step of forming the absorber layer forms one of a CIGS and a CIS absorber.

4. The method of claim 3, wherein the step of forming the absorber layer forms the CIGS absorber and comprises:
   electrodepositing a precursor layer comprising copper, indium and gallium; and
   reacting the precursor layer in presence of at least one of selenium and sulfur at a temperature range of 350 to 600° C.

5. The method of claim 1 further comprising forming a transparent layer over the absorber, and forming a terminal including busbars and conductive fingers over the transparent layer, wherein the transparent layer includes a transparent buffer layer including one of cadmium sulfide and indium sulfide deposited over the absorber and a transparent conductive layer including one of zinc oxide, indium tin oxide, and indium zinc oxide deposited over the transparent buffer layer.

6. The method of claim 1, wherein the high resistivity material comprises silicon dioxide.

7. The method of claim 1, wherein the step of depositing high resistivity material comprises one of spinning, rolling, dipping and doctor-blading.

8. A process of manufacturing a thin film solar cell base structure, comprising:
   providing a conductive substrate having a top surface including protruded surface portions and substantially flat surface portions;
   depositing a high resistivity material to form a buffer layer on the top surface of the conductive substrate, wherein the high resistivity material fully covers the substantially flat surface portions and the protruded surface portions;
   planarizing the buffer layer to expose some of the protruded surface portions;
   depositing a conductive material on the buffer layer and on the some exposed protruded surface portions to form a contact layer that is electrically connected to the conductive substrate through the some exposed protruded surface portions; and
   forming an absorber on the contact layer, wherein the contact layer is configured to act as an electrode for the absorber layer.

9. The method of claim 8, wherein the conductive material comprises one of tungsten, tantalum, molybdenum, titanium, chromium, ruthenium, iridium and osmium.

10. The method of claim 9 wherein the step of forming the absorber layer forms one of a CIGS and a CIS absorber.

11. The method of claim 10, wherein the step of forming the absorber layer forms the CIGS absorber and comprises:
   electrodepositing a precursor layer comprising copper, indium and gallium; and
   reacting the precursor layer in presence of at least one of selenium and sulfur at a temperature range of 350 to 600° C.

12. The method of claim 10 further comprising forming a transparent layer over the absorber, and forming a terminal including busbars and conductive fingers over the transparent layer, wherein the transparent layer includes a transparent buffer layer including one of cadmium sulfide and indium sulfide deposited over the Group IBIIIAVIA layer and a transparent conductive layer including one of zinc oxide, indium tin oxide, and indium zinc oxide deposited over the transparent buffer layer.

13. The method of claim 8, wherein the high resistivity material comprises silicon dioxide.

14. The method of claim 8, wherein the step of depositing a high resistivity material comprises one of spinning, rolling, dipping and doctor-blading.

15. The method of claim 8, the step of planarizing the buffer layer comprises one of chemical mechanical polishing and mechanical polishing.

* * * * *